United States Patent [19]

Moshfeghi

[11] Patent Number: 5,368,033
[45] Date of Patent: Nov. 29, 1994

[54] MAGNETIC RESONANCE ANGIOGRAPHY METHOD AND APPARATUS EMPLOYING AN INTEGRATION PROJECTION

[75] Inventor: Mehran Moshfeghi, White Plains, N.Y.

[73] Assignee: North American Philips Corporation, New York, N.Y.

[21] Appl. No.: 49,907

[22] Filed: Apr. 20, 1993

[51] Int. Cl.⁵ .................................... A61B 5/055
[52] U.S. Cl. ............... 128/653.4; 128/653.2; 324/306; 364/413.13; 382/6
[58] Field of Search ............ 128/653.2, 653.4; 364/413.15–413.20; 324/306; 382/6, 54

[56] References Cited

U.S. PATENT DOCUMENTS

| | | | |
|---|---|---|---|
| 4,827,413 | 5/1989 | Baldwin et al. | 364/413.19 |
| 4,879,652 | 11/1989 | Nowak | 364/413.18 |
| 4,914,589 | 4/1990 | Crawford | 364/413.17 |
| 4,984,160 | 1/1991 | Saint Felix et al. | 364/413.15 |
| 4,985,834 | 1/1991 | Cline et al. | 364/413.22 |
| 5,079,699 | 1/1992 | Tuy et al. | 364/413.22 |
| 5,148,499 | 9/1992 | Matsumura | 382/54 |
| 5,167,232 | 12/1992 | Parker et al. | 128/653.3 |
| 5,187,660 | 2/1993 | Ciuanlor et al. | 364/413.19 |
| 5,241,471 | 8/1993 | Trousset et al. | 364/413.18 X |
| 5,245,538 | 9/1993 | Lis | 364/413.15 |
| 5,273,040 | 12/1993 | Apicella et al. | 128/653.2 |
| 5,280,428 | 1/1994 | Wu et al. | 128/653.2 |
| 5,295,488 | 3/1994 | Lloyd et al. | 364/413.19 X |
| 5,297,550 | 3/1994 | Margosian | 128/653.2 |
| 5,297,551 | 3/1994 | Margosian et al. | 382/54 X |
| 5,309,356 | 5/1994 | Nishide et al. | 364/413.19 |

OTHER PUBLICATIONS

D. G. Nishimura et al, Magnetic Resonance Angiography, IEEE Trans. Medical Imaging, vol. 5, No. 3, (1986) pp. 140–151.
J. P. Groen et al, Angiography Based on Flow, in "Proceedings of the Annual Meeting of the Soc. of Magnetic Resonance in Medicine" (1988) p. 906.
C. L. Dumoulin et al, Three Dimensional Phase Contrast Angiography, Magnetic Resonance in Medicine, vol. 9, (1989) pp. 139–149.
G. A. Laub et al, Angiography with Gradient Motion Refocusing, J. Computer Assisted Tomography, vol. 12, (1988) 377–382.
H. E. Cline et al, Volume Rendering and Connectivity Algorithms for MR Angiography, Magnetic Resonance in Medicine, vol. 18, (1991) 384–394.
S. Napel et al, Fast Fourier Projection for MR Angiography, Magnetic Resonance in Medicine, vol. 19, (1991) 393–405.
J. Listerud et al, Trap Traced Ray by Array Processor, in "Proceedings of the Annual Meeting of the Society of Magnetic Resonance in Medicine" (1991) p. 757.
P. J. Keller et al, SIMP: An Integrative Combination with MIP, in "Proceedings of the Annual Meeting of the Society of Magnetic Resonance in Medicine" (1991) 201.
F. R. Korosec et al, A Data Adaptive Reprojective Technique for MR Angiography in "Proceedings of the Annual Meeting of the Society of Magnetic Resonance in Medicine" (1991) 820.
J. E. Siebert et al, Projection Algorithm Imparting a Consistent Spatial Perspective for 3D MR Angiography, in "Proceedings of the Annual Meeting of the Society of Magnetic Resonance in Medicine" (1990) 60.

*Primary Examiner*—Lee S. Cohen
*Assistant Examiner*—Brian L. Casler
*Attorney, Agent, or Firm*—Jack D. Slobod

[57] ABSTRACT

Magnetic Resonance Angiography (MRA) method and apparatus for determining an angiogram, in the form of a two-dimensional array of pixel intensities, from time-of-flight or phase contrast MRA volumetric image data utilizes a weighted sum, pixel by pixel, of integration projection (IP) and maximum intensity projection (MIP) 2D pixel arrays formed in the same viewing direction. The forming of the integration projection pixel array is preceded by optional background suppression and optional application of a depth cueing intensity weighting function varying along the viewing direction. The background suppression procedure contains a non-linear unsharp filtering portion followed by an intensity thresholding step.

20 Claims, 5 Drawing Sheets

MAGNETIC RESONANCE ANGIOGRAPHY METHOD AND APPARATUS EMPLOYING AN INTEGRATION PROJECTION

BACKGROUND OF THE INVENTION

1. Field of the Invention

The present invention relates to an angiography method and apparatus wherein a two-dimensional array of pixels for display as an angiogram is determined by a projection or ray casting with respect to a volumetric data set obtained from signal samples of radiation exiting a region of a body under examination, which volumetric data set exhibits a contrast between flowing blood and stationary tissue. In its particular aspects, the present invention relates to angiography employing an integration projection (Ip).

2. Background of the Invention

In the medical imaging field, a three-dimensional image data set or volumetric image may be collected from X-ray Computed Tomography (CT), Magnetic Resonance Imaging (MRI), Positron Emitted Tomography (PET), Single Photon Emission Computed Tomography (SPECT), Nuclear Medicine Tomography and Ultrasound modalities. In addition, it is a common practice to collect a volumetric image as two-dimensional image data for each of a stack of relatively thin slices. However collected, a volumetric image has intensity values or voxels centered at lattice points in a generally regular 3D grid or array. Various of these modalities are useful to produce an angiogram from a collected volumetric image data set having intensity values exhibiting an enhanced contrast between flowing blood and stationary tissue, some by employing a preparatory step of injecting a contrast agent into the bloodstream.

Magnetic Resonance Angiography (MRA) is carried out by operating magnetic resonance imaging (MRI) apparatus to collect a three-dimensional data set of voxels using an RF and magnetic field gradient pulse sequence which produces an enhanced contrast between flowing blood and stationary tissue due to flow or velocity effects. Commonly used RF and magnetic field gradient sequences for angiography involve 2D time-of-flight or 2D or 3D phase-contrast methods. In the 2D time-of-flight method, a collection of spin resonance signals for multiple parallel slices is obtained. The flow sensitive contrast is due to substantially saturating stationary spins in the slice from which spin resonance signals are collected by relatively rapid repetition of close to 90° flip angle slice selective RF excitation pulses so that only the unsaturated spins in blood flowing into the slice have relatively strong longitudinal magnetization just prior to experiencing the excitation pulses. This induces high intensity spin resonance signals from the inflowing blood, which intensity increases with the amount of inflow velocity component normal to the slice. A three-dimensional data set of voxel intensities is computed as the amplitudes obtained by two-dimensional Fourier transformation for each slice of samples of the spin resonance signals received during a read gradient for sequences repeated with different phase encoding gradient integrals. In the phase contrast method, bipolar gradient pulses are used to produce spin resonance signal phase dependence on velocity in the gradient direction. In the 3D method, a three-dimensional data set of spin resonance samples is collected. From these samples a three-dimensional data set of voxel intensities is obtained from phase values produced by a three-dimensional Fourier transformation. However obtained, the initial three-dimensional data set can be expanded by interpolating additional intervening layers or slices of voxels to produce a three-dimensional data set to be rendered for viewing purposes into a two-dimensional data set of pixels.

Display algorithms for processing three-dimensional Magnetic Resonance Angiography (MRA) data into two-dimensional form are known from H. Cline et al, "Volume Rendering and Connectivity Algorithms for MR Angiography" Magn. Res. Med. 18, pp. 384–394 (1991). A typical rendering method involves the formation of a projection image in a projection or viewing direction. Projection methods generally involve projecting or casting parallel rays through the three-dimensional data set in a viewing direction, the rays being in one-to-one association with the pixels of the projection image, and from the intensities of the voxels intercepted by or interpolated or resampled along the respective rays, determining the values of the associated pixels. Further, the two-dimensional pixel array determined by the projection rendering method can be expanded in size prior to viewing by interpolating additional intervening rows and/or columns of pixels. It is also useful to produce projection images from different angles of view corresponding to slowly rotating the viewing direction and to display these images sequentially in a cine loop. Such a cine helps the person reading the angiogram resolve vessel overlap and depth ambiguities.

The most widely used projection method is maximum intensity projection (MIP). With this method, which is computationally fast, the maximum intensities of voxels along or interpolated along ("interpolated" is herein meant to include analogous operations such as resampling) the respective rays are taken as the intensities of the associated pixels. MIP images discard much information that is present in the original volumetric image. A single MIP image does not provide any depth cues or vessel overlap information. Consequently, it is difficult to resolve depth ambiguities and vessel overlap even from a cine. Further, there is a loss of signal at vessel edges which causes apparent vessel narrowing and loss of vessel thickness information. Another deficiency of this method is that tortuous and looping vessels are difficult to distinguish from vascular aneurysms.

One alternative projection method is the so-called integration projection (IP) method in which the sums of the intensities of voxels along (or interpolated along) the respective rays are taken as the values of the associated pixels. Fast implementations can be achieved by using the relationship that a 2D integration projection image of a 3D data set in a projection direction is proportional to the inverse 2D Fourier transform of the 2D data set intercepted by (or interpolated along) a plane through the origin of the Fourier transform of the 3D data set whose normal is in the projection direction. The IP method preserves vessel thickness information because pixel intensity increases with increased vessel thickness in the projection direction. Unfortunately, there are also large contributions from integrated background voxels which obscure important vessel detail in the angiogram image. A known variation of the IP method is to sum only those voxels which have intensities above a given intensity threshold set by the operator. If the threshold is set too low, the contribution of background voxels still obscure vessel detail and result in a generally noisy image. Conversely, if the threshold is set too high, there is a loss of small vessel and edge information.

P. J. Keller et al., "SIMP: An Integrative Combination with MIP", Proceedings of the Annual Meeting of the society of Magnetic resonance in Medicine, (1991) p.201 discloses a combination of IP and MIP methods. A scaled integration projection is used for each ray intercepting at least two voxels that have intensities above a user-defined threshold. For rays not intercepting at least two such voxels, a maximum intensity projection is used. Too low a threshold results in an angiogram primarily having the characteristics of an IP image, while too high a threshold results in an angiogram primarily having the characteristics of a MIP image.

F. R. Korosec et al., "A Data Adaptive Reprojection Technique for MR Angiography", Proceedings of the Annual Meeting of the Society of Magnetic Resonance in Medicine", (1991), p.820, discloses another method that combines integration and maximum intensity projections. In this method, the original volumetric image data is compared with a first intensity threshold to define a vessel mask which is then blurred and converted to binary form. The blurred binary mask is applied to the original volumetric image data and thereafter a second, presumably higher, intensity threshold is applied to form processed volumetric image data. The final image is a weighted average of an integration projection image of the processed volumetric image data, after roll-off by a non-linear intensity transformation, and a maximum intensity projection of the original volumetric image data. This method appears critically dependant on the values set for the thresholds and further, due to the absence of depth cues, ambiguities remain as to the relative positions of overlapping vessels, which must be resolved from sequential projections at incremental angles. Further, setting the thresholds sufficiently high to suppress background may eliminate vessel detail in the integration projection contribution to the final image and such detail may be too faint, without integration along the direction of view, to be apparent in the maximum intensity projection contribution to the final image.

J. Listerud et al., "TRAP: Traced Ray by Array Processor", Proceedings of the Annual Meeting of the Society of Magnetic Resonance in Medicine, (1991) p.757, describes pseudo-surface rendering utilizing dynamic range compression and artificial lighting followed by maximum intensity projection. Artificial lighting of a range image makes structures closer to the viewer brighter than and appearing superimposed in front of those which are more distant. However, the maximum intensity projection of the range image destroys much of the depth information produced by the artificial lighting as well as suffering from the already described deficiencies of MIP.

SUMMARY OF THE INVENTION

It is an object of the present invention to provide an angiography method and apparatus for producing an angiogram containing details important for interpretation including vessel overlap and depth cue information, which are not obscured by background noise.

It is also an object of the present invention to provide an angiography method and apparatus which employs depth cueing followed by an integration projection.

It is yet another object of the present invention to provide an angiography method and apparatus which employs background suppression followed by an integration projection, which background suppression preserves the edges of vessel details.

It is still a further object of the present invention to provide an angiography method and apparatus combining integration and maximum intensity projections which includes depth cueing and/or background suppression prior to the integration projection.

Briefly, the aforementioned and other objects of the present invention are satisfied by the provision of an angiography method and apparatus for determining a two-dimensional array of pixel intensities, in which radiation, for example MR spin resonance RF signals, is induced to exit from voxels of a region of a body under examination, the radiation having a characteristic, for example - amplitude or phase, influenced by any flowing blood within said voxels, said flowing blood being in cardiovascular structure including blood vessels, the voxels having center to center spacings in respective three mutually orthogonal directions. The radiation exiting from the voxels of the region is received and sampled to form a collection of signal samples. This collection of signal samples is converted into an initial three-dimensional array of voxel intensities, each dimension of which corresponds to a different one of the three mutually orthogonal directions. A further three-dimensional array, herein referred to as a pre-depth-cued array, is derived therefrom by performing desired preliminary operations, if any, including but not limited to expansion of the size of the array through interpolation of additional intervening slices or layers and/or performing a background suppression operation thereon. The voxel intensities of this pre-depth-cued three-dimensional array are modified in accordance with a depth cueing function applied in a given direction to form a three-dimensional depth-cued array of voxel intensities. Then, the intensities of voxels intercepted by or interpolated along respective parallel rays projected through the depth-cued array of computed voxel intensities in the given direction, to form respective intensity sums for the respective rays, each of the rays being associated with a different one of the pixels of the two-dimensional array to be determined. Lastly, the values of the respective pixels of the two-dimensional array are determined as a function of the respective sums for the rays associated with the respective pixels.

In accordance with a further aspect of the present invention, in order to produce an angiogram in which integrated background voxels are inhibited from obscuring vessel detail while also preserving the edges of the vessels, a background suppression procedure is applied to a pre-background-suppressed three-dimensional array derived from the initial three-dimensional array by desired preliminary operations, if any, including but not limited to the aforementioned array size expansion by interpolation in order to produce background suppressed three-dimensional array. The background suppression procedure comprises a non-linear unsharp filtering portion followed by an intensity thresholding step. The non-linear unsharp filtering portion comprises comparing the intensities of the voxels of the pre-background-suppressed array with a first intensity value, namely, a maximum background intensity value, to segment the voxels into flow voxels and background voxels, forming a clipped array of voxels by replacing the flow voxels of the pre-background suppressed array with a second intensity value less than the first intensity value, namely, the mean of the intensities of the background voxels, applying a low-pass spatial filter to the clipped array to form a smoothed clipped array, and subtracting the smoothed clipped array from the pre-background-suppressed array, voxel by voxel. The intensity thresholding step forms a pre-depth-cued or background suppressed array. This step utilizes, as a threshold, a third intensity value computed as the first intensity value minus the second intensity value.

A further aspect of the present invention involves the determination of the respective maximum intensities of voxels intercepted by or interpolated along the respective parallel rays associated with the respective pixels of the two-dimensional array and directed in the same direction as the depth cueing function, as projected through a pre-MIP three-dimensional array of voxel intensities. The three-dimensional pre-MIP array is derived from the initial three-dimensional array by preliminary operations, if any, including but not limited to the aforementioned expansion of array size by interpolation. Further, the aforementioned determination of the values of the respective pixels of the two-dimensional array is by forming a weighted combination of the respective maximum intensities and the respective sums for the rays associated with the respective pixels.

The integration projection after background suppression and depth cueing presents vessel details including vessel overlap in a manner which is readily interpretable. The combination therewith of the maximum intensity projection is useful to introduce details that might be overly suppressed in forming the integration projection.

Other objects, features and advantages of the present invention will become apparent upon review of the following detailed description, when taken in conjunction with the appended drawing, wherein:

DETAILED DESCRIPTION OF THE PREFERRED EMBODIMENT

Figure 1:
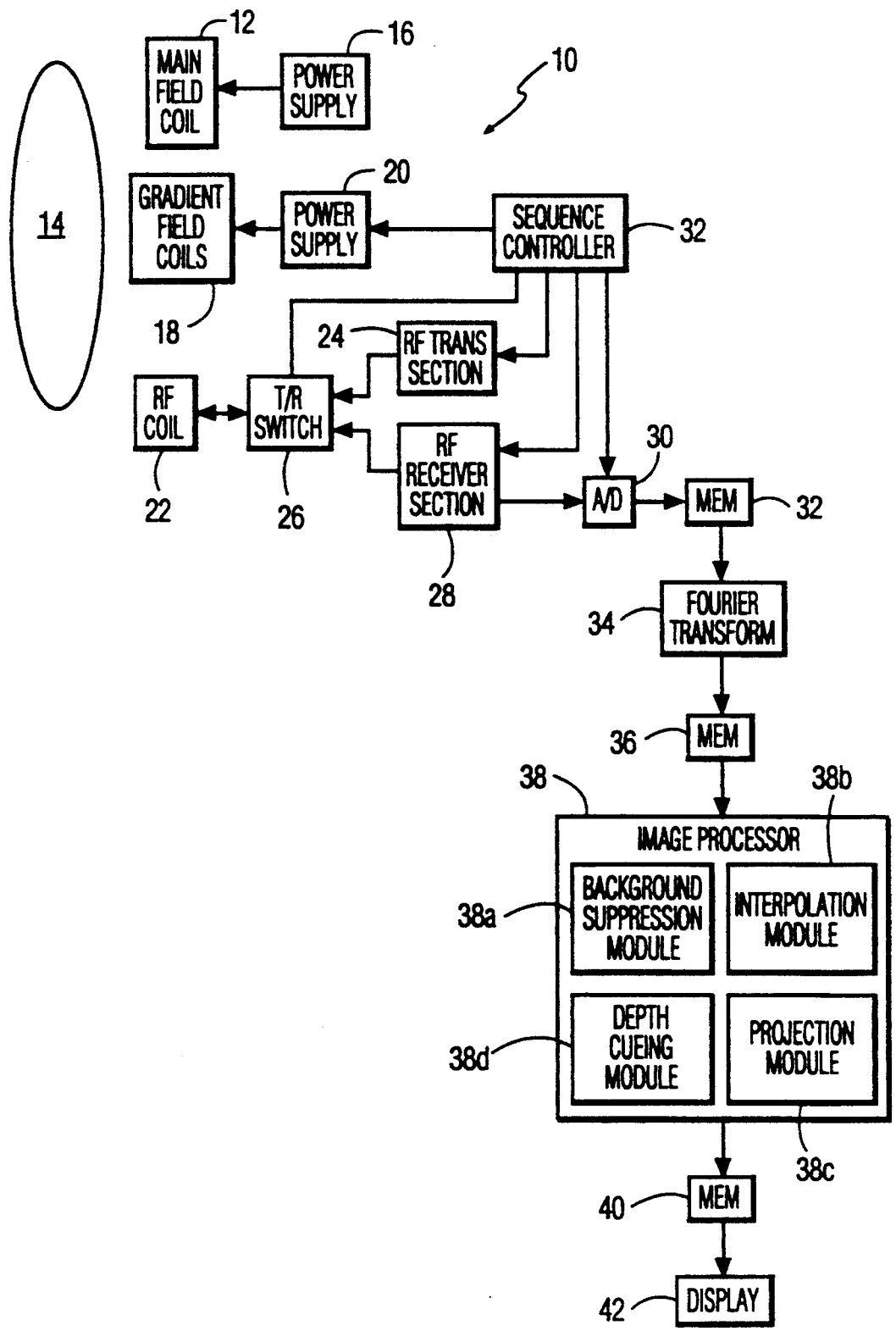
FIG. 1 is a simplified schematic of magnetic resonance imaging apparatus, including an image processor, usable for implementing the present invention.

FIG. 1 of the drawing depicts a simplified schematic of a magnetic resonance imaging (MRI) apparatus 10, which is given for the purpose of orientation. Therein, a main field coil 12 establishes a steady uniform longitudinally directed magnetic field in an elongated measurement space 14. The approximate range of field strengths in present MRI equipment is in the range of 0.1 to 4.0 Tesla. Main field coil 12 may be superconducting, rather than resistive, in which case power supply 16 is used solely for initiating the necessary coil current. Also acting upon measurement space 14 are a system of three independently controllable gradient field coils 18 producing longitudinally directed fields with strengths that vary linearly in respective three orthogonal directions, in proportion to the respective coil currents driven by power supply 20. An RF coil 22 receives RF pulses formed in RF transmitter section 24 via Transmit/Receive switch 26 and transmits these pulses into measurement space 14. As is well known, these RF pulses are at the Larmor frequency determined by the strength of the main field and the nuclei of interest (usually water protons). RF coil 22 receives the resultant spin resonance signals from the measurement space and via switch 26 feeds these signals to receiver section 28 where they are detected and then sampled and digitized by an A/D converter 30. A sequence controller controls gradient power supply 20, Transmit/Receive switch 26, RF transmitter section 24 and RF receiver section 28 so as to subject measurement space 14 to a sequence of subexperiments, each including at least a read or excitation RF pulse for converting some or all longitudinal magnetization to transverse magnetization, and gradient pulses functioning as one or more phase encoding gradients (the time integral of which is stepped from each sub-experiment to the next) followed by a read gradient during which spin resonance signals are sampled by the A/D converter 30.

Typically, for angiography using a time-of-flight procedure, the sequence is configured to induce spin resonance signals of relatively high amplitude from voxels through which blood is flowing than from voxels containing only stationary tissue. A so-called 2D "multislice" collection is commonly utilized in which a slice-selective sequence is applied sequentially to a stack of a plurality of (for example, five) equally spaced apart parallel slices, of known thickness. In a slice-selective sequence, at least the RF read pulse is applied simultaneously with a slice-selection gradient. The result of the multislice collection is a two-dimensional array (containing, for example, 256X 256 points in a spatial frequency space known as K-space) of signal samples for each slice, so that the multi-slice collection is effectively a three-dimensional array of signal samples which are supplied by A/D converter 30 to digital memory 32. The signal sample data for each slice is separately subjected to a two-dimensional Fourier Transform in block 34, which may constitute an array processor, to produce a two-dimensional array of pixel intensities for each slice. As a result, the collection of pixels for multiple parallel slices supplied by block 34 to digital memory 36 can be considered a three-dimensional array of voxel intensities (of, for example, 5×256×256 points).

In the case of the use of either a 3D time-of-flight method or 3D phase-sensitive method, a three-dimensional array of sample points in K-space is read into memory 32 with usually one of the dimensions, which is referred to herein as vertical, being quantized by less points than the other dimensions. This three-dimensional K-space array is then subjected in block 34 to a three-dimensional Fourier Transform to produce the three-dimensional array of voxel intensities in memory 36.

This three-dimensional array of voxel intensities is operated upon by an image processor 38 to supply to digital memory 40 a two-dimensional array of pixel intensities which are displayed on a display device 42, such as a CRT. Image processor, in accordance with the present invention, includes program modules for various functions including background suppression 38a, interpolation 38b, projection 38c and depth cueing 38d, which are pertinent to angiography.

Figure 2:
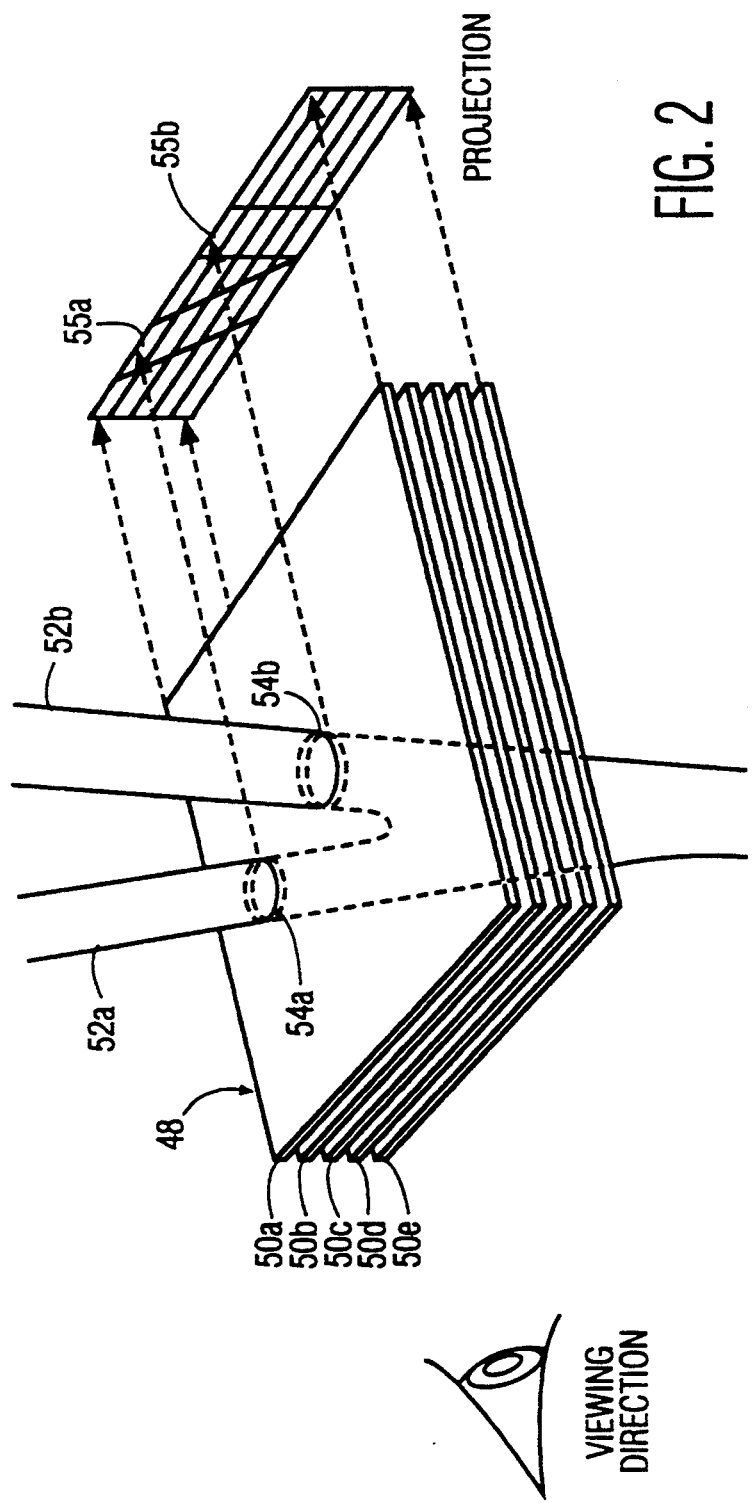
FIG. 2 is an illustration of the production of an angiogram by projection.

FIG. 2 illustrates application of projection module 38c to produce a two-dimensional array of pixels for display as an angiogram 44 which is obtained by projecting parallel rays in a viewing direction 46 through a three-dimensional array 48 of voxels which are pixels of five stacked slices 50a through 50e, each ray producing an associated pixel of the angiogram. For purposes of illustration, a three-dimensional intensity pattern corresponding to flowing blood 52 within a vessel is positioned intersecting three-dimensional array 48. As a result of the projection procedure, the voxels making up the disc shaped volumes 54a, 54b of vessel branches 52a, 52b within slice 50a, project respectively to pixels making up the areas 55a, 55b of angiogram 44. The most common projection technique for MR angiography is maximum intensity projection (MIP). In MIP, the intensity of each pixel in the angiogram is taken as the maximum intensity of the voxels through which the associated ray passes. A less common projection technique is integration projection (IP), wherein, the intensity of each pixel of the angiogram is taken as the sum of the intensities of the voxels through which the associated ray passes. As, is apparent, in the absence of interpolation either before or after projection, the angiogram produced in a horizontal viewing direction of the illustrated stack of slices 50a through 50e would be only five pixels high.

Figure 3:
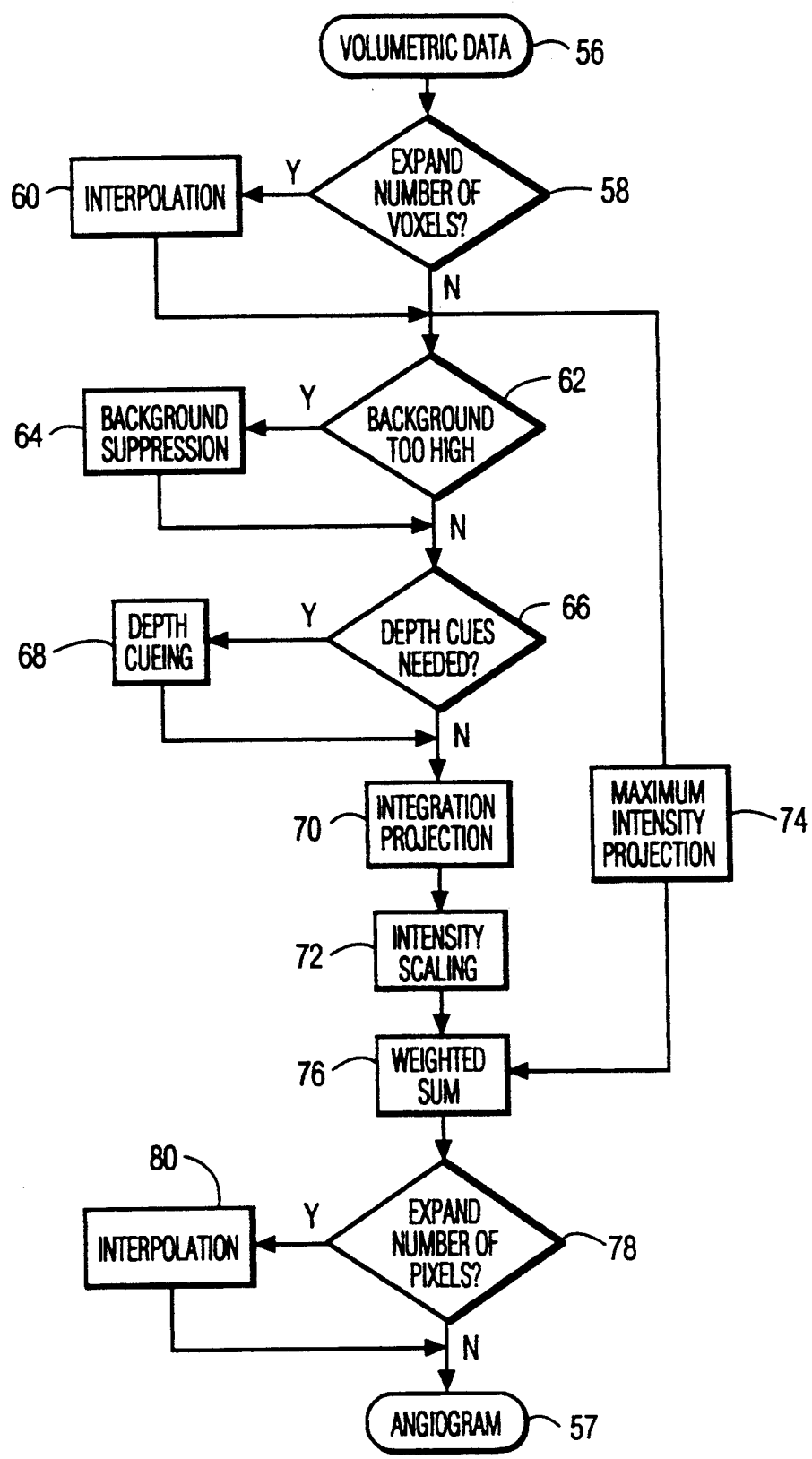
FIG. 3 is a flow chart of the operations, including background suppression and depth cueing procedures, performed by the image processor of FIG. 1.

The operation of image processor 38 is indicated by the flow chart of FIG. 3. The volumetric data set 56 stored in memory 36 is the input thereto and the angiogram 57 stored in memory 40 is the output therefrom. First it is determined at step 58 whether the number of voxels in the volumetric data set is to be expanded. This may be determined by operator input, but preferably a default condition is provided in which whether or not to interpolate, and the number and orientation of intervening slices or layers to be interpolated, if any, is given by default based upon the spatial configuration of the volumetric data set 56 presented. Interpolation procedure 60 is performed by module 38b only if the determination at step 58 is YES. As noted, if only a small number of slices are acquired, it would be desirable to improve apparent resolution by interpolating additional voxels at least in the slice direction. The preferred technique for interpolation of each slice intervening originally adjoining slices (or layers intervening originally adjoining layers) is set forth in my patent application entitled "Directional Interpolation For Magnetic Resonance Angiography" which was filed May 21, 1992 and is pending under U.S. patent application Ser. No. 07/886,679, which is herein incorporated by reference. In the directional interpolation procedure disclosed and claimed therein, there is a determination for each voxel in one of the originally adjoining slices whether a voxel exists in the other of the originally adjoining slices which corresponds thereto with respect to position relative to local intensity patterns. A local direction of interpolation directed between these voxels is used if correspondence is found. Otherwise, the conventional local direction of interpolation normal to the slice is used. Such directional interpolation eliminates the staircase artifact which may otherwise appear along edges of obliquely directed vessels.

Figure 4:
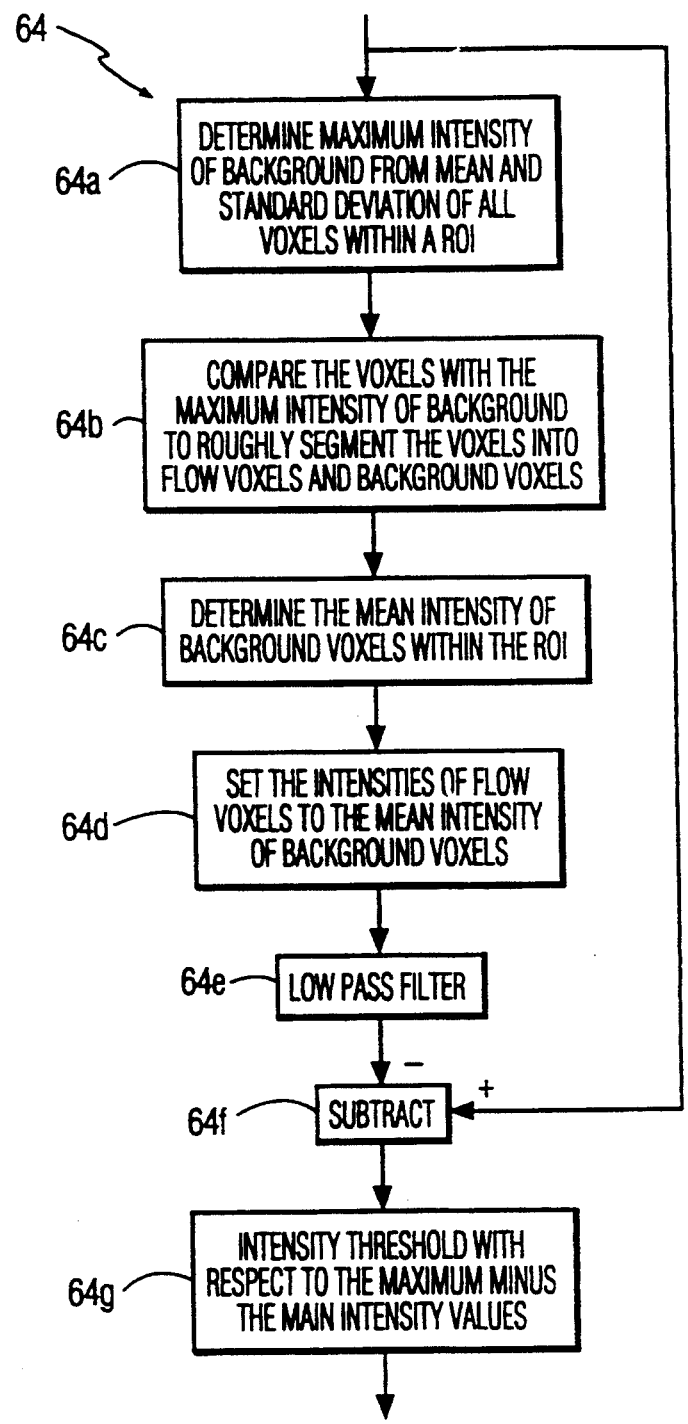
FIG. 4 is a flow chart of the background suppression procedure of FIG. 3.

Next, it is determined at step 62 whether background is too high, necessitating background suppression procedure 64 to be performed by module 38a. This procedure is detailed in FIG. 4 and will be seen to comprise a nonlinear unsharp filtering procedure portion comprising steps 64a-64f followed by an intensity thresholding step 64g. The determination of whether to perform background suppression also may be by operator input. In step 64b, the voxels of the input array are roughly segmented into flow voxels and background voxels and a mean intensity of the background voxels is determined. This segmentation is accomplished by comparing voxel intensities with a maximum background intensity, flow voxels having intensities greater than the maximum background intensity and background voxels having intensities less than or equal to the maximum background voxel intensity.

Figure 5:
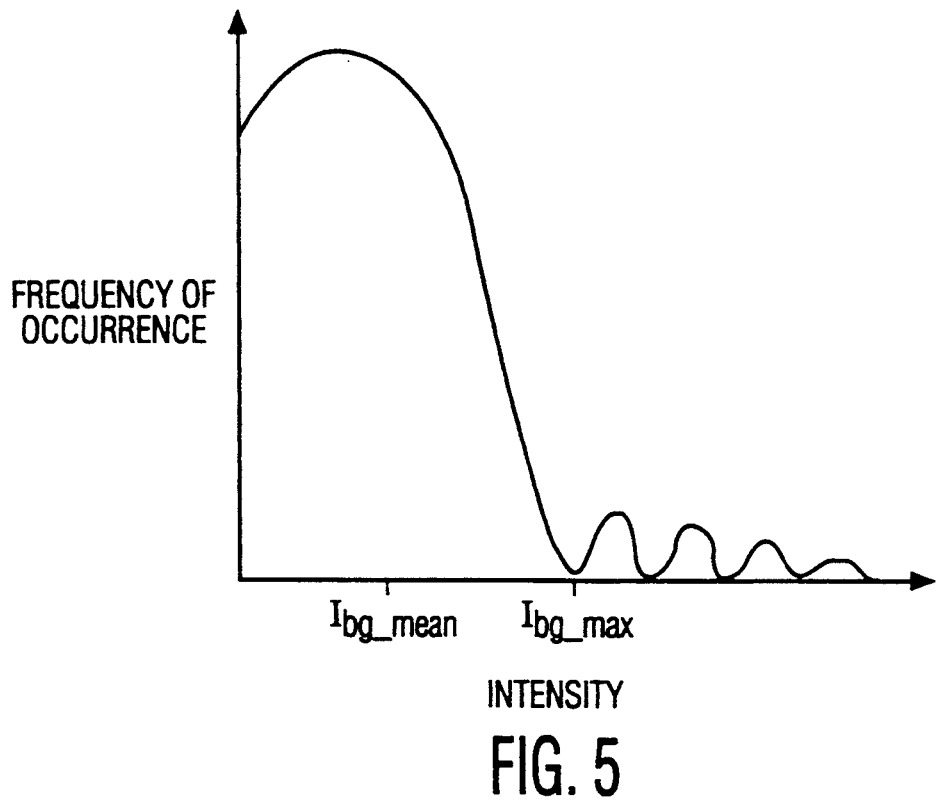
FIG. 5 is a typical histogram of the input array to the background suppression procedure of FIG. 3.

While the maximum background intensity could be a value which is input by an operator, preferably the maximum background intensity is automatically determined in step 64a for an operator designated Region of Interest (ROI) containing blood vessel structure. A typical histogram of such a region is shown in FIG. 5 as having a high frequency of occurrence or number of voxels peak at a low intensity approximately at a mean background intensity $I_{bg-mean}$, and smaller frequency of occurrence peaks at intensities greater than a maximum background intensity $I_{bg-max}$, corresponding to flow. If $I_{mean}$ and $I_{sd}$ are the mean and standard deviation, respectively, of the intensities of all the voxels in the ROI, then the maximum background intensity is determined in step 64a, as follows:

$$I_{bg-max} = I_{mean} + C \cdot I_{sd}$$

where C is a constant. For time-of-flight images, it was found empirically that a value of C=2.0 is a good compromise between suppressing the background without losing the small vessels. After the aforementioned segmentation, the mean intensity of the background, $I_{bg-mean}$, is determined in step 64c as the average of all voxel intensities within the ROI having an intensity less than or equal to $I_{bg-max}$. In step 64d, a clipped array is formed by setting the intensities of all voxels corresponding to flow in the array input to procedure 64 (those having intensities greater than the maximum background intensity $I_{bg-max}$) to the mean background intensity $I_{bg-mean}$. Then, in step 64e a low pass filtering kernel is applied to the clipped array to form a smoothed clipped array. A boxcar averaging filter which is 3 voxels wide in each dimension filtered is a suitable kernel. Thereafter, in step 64f, the smoothed clipped array, is subtracted from the input array to procedure 64. The aforementioned non-linear unsharp filtering portion effects a high pass filtering operation that does not blur vessel edges. It generally reduces the range of background intensities to zero through $I_{bg-max} - I_{bg-mean}$. Then, in intensity thresholding step 64g, voxels having an intensity less than or equal to $I_{thresh} = I_{bg-max} - I_{bg-mean}$ are set to zero.

In step 66 it is determined by operator input whether depth cues are to be provided. If the depth cueing option is selected, then in step 66 a scale function having an intensity multiplying scale factor that monotonically increases over distance in the viewing direction from back to front depth reference locations fixed with respect to the volumetric image is used to introduce a contrast whereby closer objects appear brighter than more distant ones. Although various monotonic functions are useful, that currently considered preferable is graphed in FIG. 6 and will be seen to be a linearly increasing function.

Figure 6:
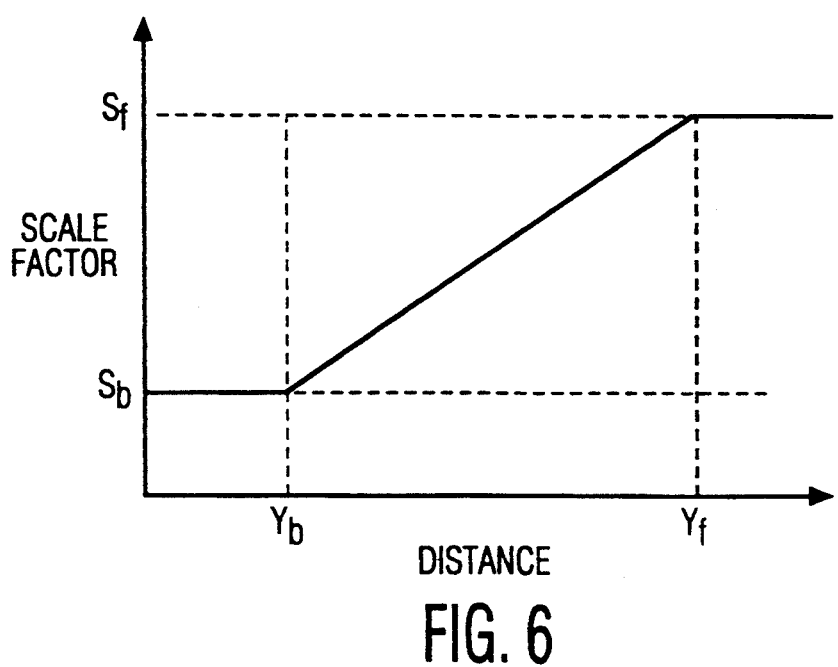
FIG. 6 is a graph of a depth cueing function used in the depth cueing procedure of FIG. 3.

Referring to FIG. 6, assume for the purpose of illustration that the viewing direction is along an axis Y. Front and back depth cue reference planes are indicated at $Y=Y_f$ and $Y=Y_b$, respectively. Then the scale factor, S, for multiplying the intensity of a voxel that is between the two planes at location Y is given by:

$$S = S_b + (Y - Y_b)(S_f - S_b)/(Y_f - Y_b)$$

where the scale factors for voxels at the front and back depth cue reference planes are $S=S_f$ and $S=S_b$, respectively. For locations Y behind $Y_b$, $S=S_b$, and for locations Y in front of $Y_f$, $S=S_f$.

Following the optional depth cueing procedure, an integration projection is performed in step 70 by assigning to the pixels associated with parallel rays projected through the volumetric image in a viewing direction (generally illustrated in FIG. 2), the sum of the intensities of the voxels intercepted by the respective rays. It should be understood that when, in a projection procedure, the parallel rays do not pass precisely through the centers of the voxels, it is conventional to interpolate voxel intensities at points along the rays, or equivalently, to resample (by an interpolation process) the volumetric image to determine new voxel centers along the rays. A tri-linear interpolation of voxel intensities along projection rays is well known and preferred. The resultant two-dimensional image is then scaled in intensity to lie in the range zero to $I_{newmax}$, by using the following linear formula:

$$I_{new} = I_{newmax}(I_{old} - I_{thresh})/(I_{oldmax} - I_{thresh})$$

where:

$I_{old}$=Intensity of a pixel having a non-zero intensity prior to scaling.

$I_{new}$=Intensity of the pixel after scaling.

$I_{newmax}$=A maximum allowed intensity value after scaling (usually 255 for byte scaled images).

$I_{oldmax}$=Maximum intensity of the pixels prior to scaling. $I_{threshol}$=The intensity threshold used in step 64 g. Those pixels having a zero intensity prior to scaling are not treated by the scaling operation and therefore retain a zero intensity after scaling.

The resultant scaled integration projection (IP) image shows vessel overlap and thickness. When the background suppression procedure 64 has been employed, the IP image has lower background levels than a conventional maximum intensity projection (MIP) image. Further, when the depth cueing step 68 has been used, depths cues enable visualization of the relative positions of overlapping vessels. The IP image compares unfavorably to an MIP image in respect to small vessels. These appear narrow and dark. I have found that the deficiencies of the resultant IP image can be compensated by the introduction of a further pixel intensity component due to maximum intensity projection.

Accordingly, in step 74, a maximum intensity projection is performed with respect to the pre-background suppression volumetric image (the volumetric image input to background suppression selection step 62) in the same direction and with the same configuration of parallel projection rays as used in the integration projection (IP) step 70. As is conventional, the intensities of the pixels associated with the respective projection rays are determined as the maxima of the voxel intensities intercepted by or interpolated along the respective rays. Then in step 76, a weighted sum, pixel by pixel, of the resultant MIP image and the scaled IP image is formed in accordance with the following formula:

$$I_{sum} = (I_{mip} + D \cdot I_{new})/(1+D)$$

where:

$I_{mip}$=Intensity of a pixel in the MIP image.

$I_{new}$=Intensity of the same pixel in the scaled IP image.

D=A constant preferably in the range of 1 to 4.

Prior to forming the weighted sum in step 76, the intensities, $I_{mip}$, of the MIP image are also scaled to be in the range zero to $I_{newmax}$.

After the formation of the weighted sum two-dimensional image, it is determined in step 78, for example, from a number of lines or pixels to be spanned by the ROI in display 42, whether to expand the number of pixels in the weighted sum image. If an expanded number of pixels is indicated, then this is done by the 2D interpolation step 80, to determine further lines of pixels between existing lines. Preferably, this step also uses the directional interpolation techniques in my prior patent application which was herein previously referred to and incorporated by reference, in connection with the 3D interpolation step 60.

The final angiogram image 57 has the small vessel detail of the MIP image, and the vessel crossing, thickness, and depth information of the depth-cued integration projection image. The background suppression procedure 64 has been found useful for time-of-flight volumetric image data, where background values are high. Phase contrast volumetric image data, however, has high vessel-to-background contrast and may not require background suppression. The depth cueing step has been found very useful for visualizing tortuous cerebral arteries.

The present invention has been found to provide more information in each projection and to therefore require fewer projections from different directions of view to enable interpretation of the angiogram. Studies for which the method appears promising is the circle of willis, sinus, carotid bifurcation, carotid siphon, pulmonary and peripheral vessels.

It should now be apparent that the objects of the present invention have been satisfied, and further that while the present invention has been described in detail with respect to MR angiography, many principles thereof are applicable to other medical imaging modalities including but not limited to CT and nuclear medicine tomography. Further, numerous modifications in the details given are possible within the intended spirit and scope of the invention.

What is claimed is:

1. An angiography method for determining a two-dimensional array of pixel intensities, said method comprising:

inducing radiation to exit from voxels of a region of a body under examination, said radiation having a characteristic influenced by any flowing blood within said voxels, said flowing blood being in cardiovascular structure including blood vessels, said voxels having center to center spacings in respective three mutually orthogonal directions;

receiving and sampling the radiation exiting from the voxels of said region to form a collection of signal samples;

converting said collection of signal samples into an initial three-dimensional array of voxel intensities, each dimension of said array corresponding to a different one of said three mutually orthogonal directions;

modifying the voxel intensities of a pre-depth-cued three-dimensional array of voxel intensities derived from said initial array in accordance with a depth cueing function applied in a given direction to form a three-dimensional depth-cued array of voxel intensities;

summing the intensities of voxels intercepted by or interpolated along respective parallel rays projected in said given direction through said depth-cued array of computed voxel intensities to form respective intensity sums for the respective rays, each of said rays being associated with a different one of the pixel intensities of the two-dimensional array to be determined; and determining the values of the respective pixel intensities of said two-dimensional array as a function of the respective sums for the rays associated with the respective pixel intensities.

2. A method as claimed in claim 1, further comprising determining respective maximum intensities of voxels intercepted by or interpolated along said respective parallel rays associated with the respective pixel intensities and directed in said given direction, as projected through a pre-MIP three-dimensional array of voxel intensities derived from said initial three-dimensional array, and wherein said determining of the values of the respective pixel intensities of said two-dimensional array is by forming a weighted combination of said respective maximum intensities and said respective sums for the rays associated with said respective pixels.

3. A method as claimed in claim 2, wherein a pre-background-suppressed three-dimensional array is derived from said initial three-dimensional array and said pre-depth-cued three-dimensional array is derived from said pre-background-suppressed array by the following operations:

comparing the intensities of the voxels of said pre-background-suppressed array with a first intensity value to segment said voxels into flow voxels and background voxels;

forming a clipped array of voxels by replacing the flow voxels of said pre-background suppressed array with a second intensity value less than the first intensity value;

applying a low-pass spatial filter to said clipped array to form a smoothed clipped array;

subtracting said smoothed clipped array from said pre-background suppressed array, voxel by voxel to form a pre-thresholded array; and intensity thresholding said pre-thresholded array with respect to a third intensity value to form said pre-depth-cued array.

4. A method as claimed in claim 3, wherein said induced and received radiation are MR spin resonance RF signals.

5. A method as claimed in claim 2, wherein said induced and received radiation are MR spin resonance RF signals.

6. A method as claimed in claim 1, wherein a pre-background-suppressed three-dimensional array is derived from said initial three-dimensional array and said pre-depth-cued three-dimensional array is derived from said pre-background-suppressed array by the following operations:

comparing the intensities of the voxels of said pre-background-suppressed array with a first intensity value to segment said voxels into flow voxels and background voxels;

forming a clipped array of voxels by replacing the flow voxels of said pre-background suppressed array with a second intensity value less than the first intensity value;

applying a low-pass spatial filter to said clipper array to form a smoothed clipped array;

subtracting said smoothed clipped array from said pre-background suppressed array, voxel by voxel to form a pre-thresholded array; and intensity thresholding said pre-thresholded array with respect to a third intensity value to form said pre-depth-cued array.

7. A method as claimed in claim 6, wherein said induced and received radiation are MR spin resonance RF signals.

8. A method as claimed in claim 1, wherein said induced and received radiation are MR spin resonance RF signals.

9. An angiography method for determining a two-dimensional array of pixel intensities, said method comprising:

inducing radiation to exit from voxels of a region of a body under examination, said radiation having a characteristic influenced by any flowing blood within said voxels, said flowing blood being in cardiovascular structure including blood vessels, said voxels having center to center spacings in respective three mutually orthogonal directions;

receiving and sampling the radiation exiting from the voxels of said region to form a collection of signal samples;

converting said collection of signal samples into an initial three-dimensional array of voxel intensities, each dimension of said array corresponding to a different one of said three mutually orthogonal directions;

deriving a background suppressed three dimensional array by the following procedure from a pre-background-suppressed three-dimensional array derived from said initial three-dimensional array:

a) comparing the intensities of the voxels of said pre-background-suppressed array with a first intensity value to segment said voxels into flow voxels and background voxels;

b) forming a clipped array of voxels by replacing the flow voxels of said pre-background suppressed array with a second intensity value less than the first intensity value;

c) applying a low-pass spatial filter to said clipped array to form a smoothed clipped array;

d) subtracting said smoothed clipped array from said pre-background suppressed array, voxel by voxel to form a pre-thresholded array; and e) intensity thresholding said pre-thresholded array with respect to a third intensity value to form said background suppressed array;

summing the intensities of voxels intercepted by or interpolated along respective parallel rays projected in a given direction through a pre-projection three dimensional array derived from said background suppressed array, to form respective intensity sums for the respective rays, each of said rays being associated with a different one of the pixel interstices of the two-dimensional array to be determined; and, determining the values of the respective pixel intensities of said two-dimensional array as a function of the respective sums for the rays associated with the respective pixel intensities.

10. A method as claimed in claim 9, further comprising determining respective maximum intensities of voxels intercepted by or interpolated along said respective parallel rays associated with the respective pixel intensities and directed in said given direction, as projected through a pre-MIP three-dimensional array of voxel intensities derived from said initial three-dimensional array, and wherein said determining of the values of the respective pixel intensities of said two-dimensional array is by forming a weighted combination of said respective maximum intensities and said respective sums for the rays associated with said respective pixel intensities.

11. A method as claimed in claim 10, wherein said induced and received radiation are MR spin resonance RF signals.

12. A method as claimed in claim 9, wherein said induced and received radiation are MR spin resonance RF signals.

13. An angiography apparatus for determining a two-dimensional array of pixels intensities, said apparatus comprising:

means for inducing radiation to exit from voxels of a region of a body under examination, said radiation having a characteristic influenced by any flowing blood within said voxels, said flowing blood being in cardiovascular structure including blood vessels, said voxels having center to center spacings in respective three mutually orthogonal directions;

means for receiving and sampling the radiation exiting from the voxels of said region to form a collection of signal samples;

means for converting said collection of signal samples into an initial three-dimensional array of voxel intensities, each dimension of said array corresponding to a different one of said three mutually orthogonal directions; and image processing means comprising:

a) means for modifying the voxel intensities of a pre-depth-cued three-dimensional array of voxel intensities derived from said initial array in accordance with a depth cueing function applied in a given direction to form a three-dimensional depth cued array of voxel intensities;

b) means for summing the intensities of voxels intercepted by or interpolated onto respective parallel rays projected through said depth cued array of computed voxel intensities in said given direction, to form respective intensity sums for the respective rays, each of said rays being associated with a different one of the pixel intensities of the two-dimensional array to be determined; and c) means for determining the values of the respective pixel intensities of said two-dimensional array as a function of the respective sums for the rays associated with the respective pixel intensities.

14. An apparatus as claimed in claim 13, wherein said image rendering means further comprises:

d) means for determining respective maximum intensities of voxels intercepted by or interpolated along said respective parallel rays associated with the respective pixel intensities and directed in said given direction, as projected through a pre-MIP three-dimensional array of voxel intensities derived from said initial three-dimensional array;

and wherein said means for determining the values of the respective pixels intensities of said two-dimensional array comprises means for forming a weighted combination of said respective maximum intensities and said respective sums for the rays associated with said respective pixels intensities.

15. An apparatus as claimed in claim 14, wherein a pre-background-suppressed three-dimensional array is derived from said initial three-dimensional array and further comprising background suppression means for deriving said pre-depth-cued three-dimensional array from said pre-background-suppressed array, said background suppression means comprising means for:

comparing the intensities of the voxel of said pre-background-suppressed array with a first intensity value to segment said voxels into flow voxels and background voxels;

forming a clipped array of voxels by replacing the flow voxels of said pre-background suppressed array with a second intensity value less than the first intensity value;

applying a low-pass spatial filter to said clipped array to form a smoothed clipped array;

subtracting said smoothed clipped array from said pre-background suppressed array, voxel by voxel to form a pre-thresholded array; and intensity thresholding said pre-thresholded array with respect to a third intensity value to form said pre-depth-cured array.

16. An apparatus as claimed in claim 15, wherein said induced and received radiation are MR spin resonance RF signals.

17. An apparatus as claimed in claim 14, wherein said induced and received radiation are MR spin resonance RF signals.

18. An apparatus as claimed in claim 13, wherein a pre-background-suppressed three-dimensional array is derived from said initial three-dimensional array and wherein said image processing means further comprises background suppression means for converting said pre-background suppressed array to said pre-depth-cued array, said background suppression means comprising means for:

comparing the intensities of the voxels of said pre-background-suppressed array with a first intensity value to segment said voxels into flow voxels and background voxels;

forming a clipped array of voxels by replacing the flow voxels of said pre-background suppressed array with a second intensity value less than the first intensity value;

applying a low-pass spatial filter to said clipped array to form a smoothed clipped array;

subtracting said smoothed clipped array from said pre-background suppressed array, voxel by voxel to form a pre-thresholded array; and intensity thresholding said pre-thresholded array with respect to a third intensity value to form said pre-depth-cued array.

19. An apparatus as claimed in claim 18, wherein said induced and received radiation are MR spin resonance RF signals.

20. An apparatus as claimed in claim 13, wherein said induced and received radiation are MR spin resonance RF signals.

* * * * *